US010784273B2

(12) United States Patent
Howder et al.

(10) Patent No.: US 10,784,273 B2
(45) Date of Patent: Sep. 22, 2020

(54) MEMORY ARRAYS AND METHODS USED IN FORMING A MEMORY ARRAY

(71) Applicant: Micron Technology, Inc., Boise, ID (US)

(72) Inventors: Collin Howder, Meridian, ID (US); Gordon A. Haller, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/251,241

(22) Filed: Jan. 18, 2019

(65) Prior Publication Data

US 2020/0235112 A1 Jul. 23, 2020

(51) Int. Cl.
*H01L 27/11556* (2017.01)
*G11C 5/06* (2006.01)
(Continued)

(52) U.S. Cl.
CPC ........ *H01L 27/11556* (2013.01); *G11C 5/063* (2013.01); *H01L 27/1157* (2013.01);
(Continued)

(58) Field of Classification Search
CPC ......... H01L 27/11556; H01L 27/11558; H01L 27/11582; H01L 27/11524; H01L 27/1157; G11C 5/063
See application file for complete search history.

(56) References Cited

U.S. PATENT DOCUMENTS 9,431,419 B2 8/2016 Fukuzumi et al.
9,741,737 B1 8/2017 Huang et al.
(Continued)

FOREIGN PATENT DOCUMENTS

KR 10-2016-0018921 2/2016
KR 10-2016-0094186 8/2016
(Continued)

OTHER PUBLICATIONS

WO PCT/US2019/057781 Search Rept., dated Feb. 17, 2020, Micron Technology, Inc.
(Continued)

*Primary Examiner* — Mohammed R Alam
(74) *Attorney, Agent, or Firm* — Wells St. John P.S.

(57) ABSTRACT

A method used in forming a memory array comprises forming a substrate comprising a conductive tier, a first insulator tier above the conductive tier, a sacrificial material tier above the first insulator tier, and a second insulator tier above the sacrificial material tier. A stack comprising vertically-alternating insulative tiers and wordline tiers is formed above the second insulator tier. Channel material is formed through the insulative tiers and the wordline tier. Horizontally-elongated trenches are formed through the stack to the sacrificial material tier. Sacrificial material is etched through the horizontally-elongated trenches selectively relative to material of the first insulator tier and selectively relative to material of the second insulator tier. A laterally-outer sidewall of the channel material is exposed in the sacrificial material tier. A conductive structure is formed directly against the laterally-outer sidewall of the channel material in the sacrificial material tier. The conductive structure extends through the first insulator tier and directly electrically couples the channel material to the conductive tier. Structure embodiments are disclosed.

22 Claims, 11 Drawing Sheets

FIG. 9

(51) Int. Cl.
*H01L 27/11558* (2017.01)
*H01L 27/11582* (2017.01)
*H01L 27/11524* (2017.01)
*H01L 27/1157* (2017.01)

(52) U.S. Cl.
CPC .. *H01L 27/11524* (2013.01); *H01L 27/11558* (2013.01); *H01L 27/11582* (2013.01)

(56) References Cited

U.S. PATENT DOCUMENTS

| | | |
|---|---|---|
| 2015/0017770 A1 | 1/2015 | Lee et al. |
| 2016/0043100 A1 | 2/2016 | Lee et al. |
| 2016/0111435 A1 | 4/2016 | Pang et al. |
| 2016/0163389 A1 | 6/2016 | Zhang et al. |
| 2016/0163729 A1 | 6/2016 | Zhang et al. |
| 2016/0172370 A1 | 6/2016 | Makala et al. |
| 2016/0225754 A1 | 8/2016 | Jang |
| 2017/0309339 A1 | 10/2017 | Hsiung et al. |
| 2018/0114794 A1 | 4/2018 | Jang et al. |
| 2018/0204849 A1 | 7/2018 | Carlson et al. |
| 2018/0254285 A1* | 9/2018 | Lee .................. H01L 27/11582 |
| 2018/0294273 A1 | 10/2018 | Liao et al. |

FOREIGN PATENT DOCUMENTS

| | | |
|---|---|---|
| KR | 10-2017-0093099 | 8/2017 |
| KR | 10-2018-0045975 | 5/2018 |
| WO | WO 2016/093947 | 6/2016 |

OTHER PUBLICATIONS

WO PCT/US2019/057781 Written Opin, dated Feb. 17, 2020, Micron Technology, Inc.
U.S. Appl. No. 15/890,503, filed Feb. 7, 2018, by Howder et al.
U.S. Appl. No. 16/194,926, filed Nov. 19, 2018, by Chandolu et al.
U.S. Appl. No. 16/194,946, filed Nov. 19, 2018, by Clampitt et al.
U.S. Appl. No. 16/277,311, filed Feb. 15, 2019, by Bhushan et al.
U.S. Appl. No. 16/807,388, filed Mar. 3, 2020, by Hopkins.
U.S. Appl. No. 16/807,523, filed Mar. 3, 2020, by Hopkins.
U.S. Appl. No. 16/807,573, filed Mar. 3, 2020, by Hopkins et al.

* cited by examiner

MEMORY ARRAYS AND METHODS USED IN FORMING A MEMORY ARRAY

TECHNICAL FIELD

Embodiments disclosed herein pertain to memory arrays and to methods used in forming a memory array.

BACKGROUND

Memory is one type of integrated circuitry and is used in computer systems for storing data. Memory may be fabricated in one or more arrays of individual memory cells. Memory cells may be written to, or read from, using digit lines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1", In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

DETAILED DESCRIPTION OF EXAMPLE EMBODIMENTS

Embodiments of the invention encompass methods used in forming an array of transistors and/or memory cells, for example an array of NAND or other memory cells having peripheral control circuitry under the array (e.g., CMOS under-array). Embodiments of the invention encompass so-called "gate-last" or "replacement-gate" processing, so-called "gate-first" processing, and other processing whether existing or future-developed independent of when transistor gates are formed. Embodiments of the invention also encompass an array of transistors and/or memory cells (e.g., NAND or other memory cells) independent of method of manufacture. First example method embodiments are described with reference to FIGS. 1-21 which may be considered as a "gate-last" or "replacement-gate" process.

Figure 1:
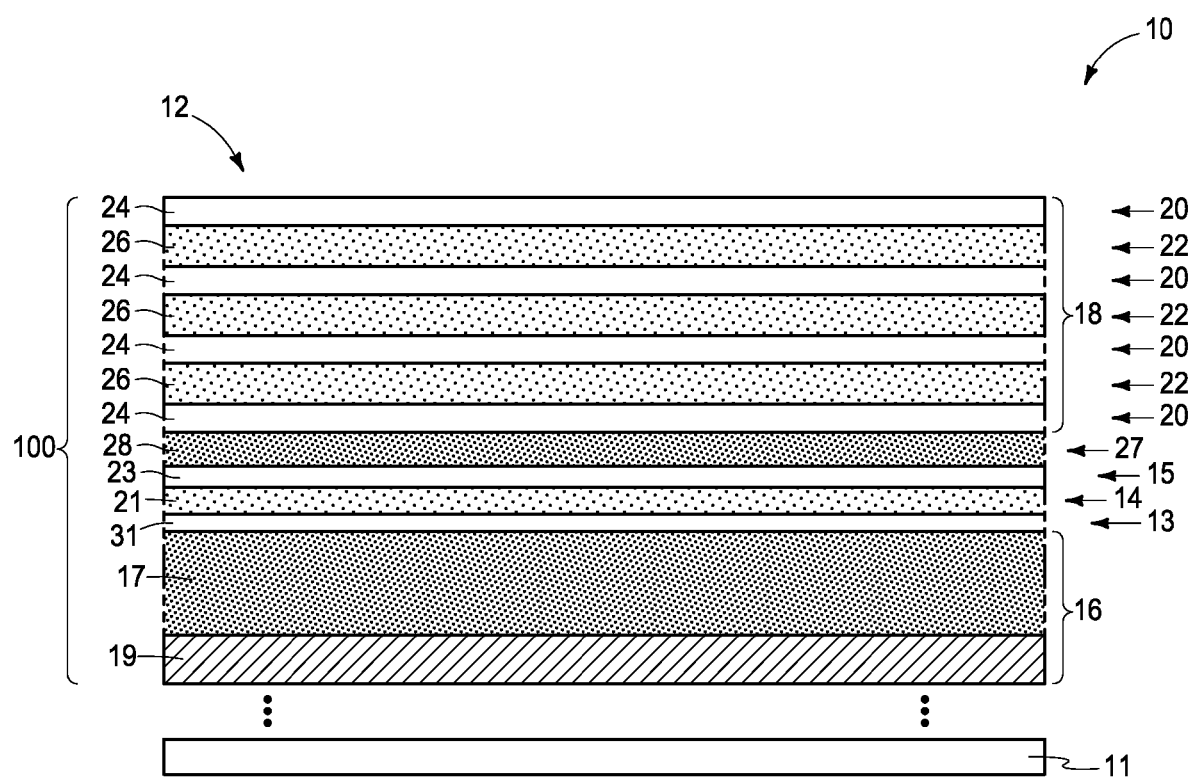
FIG. 1 is a diagrammatic cross-sectional view of a portion of a substrate in process in accordance with an embodiment of the invention.

FIG. 1 shows a construction 10 in a method of forming an array 12 of elevationally-extending strings of transistors and/or memory cells (not yet shown). Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIG. 1-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

Substrate/construction 10 comprises a conductive tier 16. Example conductive tier 16 is shown as comprising a conductive material 17 (e.g., conductively-doped semiconductive material such as conductively-doped polysilicon) above a conductive material 19 (e.g., metal material such as WSix). Conductive tier 16 may comprise part of control circuitry (e.g., peripheral-under-array circuitry) used to control read and write access to the transistors and/or memory cells that will be formed within array 12.

Construction 10 comprises a first insulator tier 13 above conductive tier 16, a sacrificial material tier 14 above first insulator tier 13, and a second insulator tier 15 above sacrificial material tier 14. In some embodiments, first insulator tier 13 comprises an insulative metal oxide 31 and second insulator tier 15, when present, comprises insulative metal oxide 23 which may be of the same or different composition as that of insulative metal oxide 31. In the context of this document, "metal" of an "insulative metal oxide" is any elemental metal including any of the elemental semimetals (i.e., B, Si, Ge, As, Sb, Te, Po, and At). Some examples include $SiO_2$, $Al_2O_3$, $ZrO_2$, silicates, aluminates, $Hf_xZr_yO_z$, and $Si_xAl_yO_z$. In one embodiment, the insulative metal oxide comprises multiple elemental metals and in one such embodiment wherein one of the elemental metals is Si. In one embodiment, at least a majority of the insulative metal oxide is stoichiometric, and in another embodiment at least a majority of the insulative metal oxide is non-stoichiometric. Regardless, the insulative metal oxide may contain a conductive metal oxide species (e.g., $RuO_2$, $IrO_2$, etc.) but nevertheless be overall insulative when considered as a whole (i.e., it has overall compositional intrinsic electrical conductivity of no greater than $1 \times 10^{-10}$ siemen/cm at 20° C.). Sacrificial material tier 14 comprises sacrificial material 21 that may be etched selectively relative to material 31 of first insulator tier 13 and selectively relative to material 23 of second insulator tier 15. One ideal example is silicon nitride, although any other suitable material may be used including metal material. A conductively-doped semiconductive material tier 27 is above sacrificial material tier 14 and comprises conductively-doped semiconductive material 28 (e.g., conductively-doped polysilicon).

Substrate construction 10 comprises a stack 18 above second insulator tier 15 (and conductively-doped semiconductive material tier 27 when present). Stack 18 comprises vertically-alternating insulative tiers 20 and wordline tiers 22, with conductively-doped semiconductive material tier 27 when present being vertically between second insulator tier 15 and a lowest of insulative tiers 20. Only a small number of tiers 20 and 22 is shown, with more likely stack 18 comprising dozens, a hundred or more, etc. of tiers 20 and 22. Other circuitry that may or may not be part of peripheral acid/or control circuitry may be between conductive tier 16 and stack 18. For example, multiple vertically-alternating tiers of conductive material and insulative material of such circuitry may be below a lowest of the wordline tiers 22 and/or above an uppermost of the wordline tiers 22. Regardless, wordline tiers 22 may not comprise conductive material and insulative tiers 20 may not comprise insulative material or be insulative at this point in processing. Example wordline tiers 22 comprise first material 26 (e.g., silicon nitride) which may be wholly or partially sacrificial. Example insulative tiers 20 comprise second material 24 (e.g., silicon dioxide) that is of different composition from that of first material 26 and which may be wholly or partially sacrificial. Collectively, stack 18 and tiers 16, 13, 14, 15, and 27 may be considered as a stack 100. Only one stack 18 and one stack 100 are shown, although more than one stack 18 and/or one stack 100 may be above or below (not shown) stack 18 and/or stack 100 above or below substrate 11.

Figure 2:
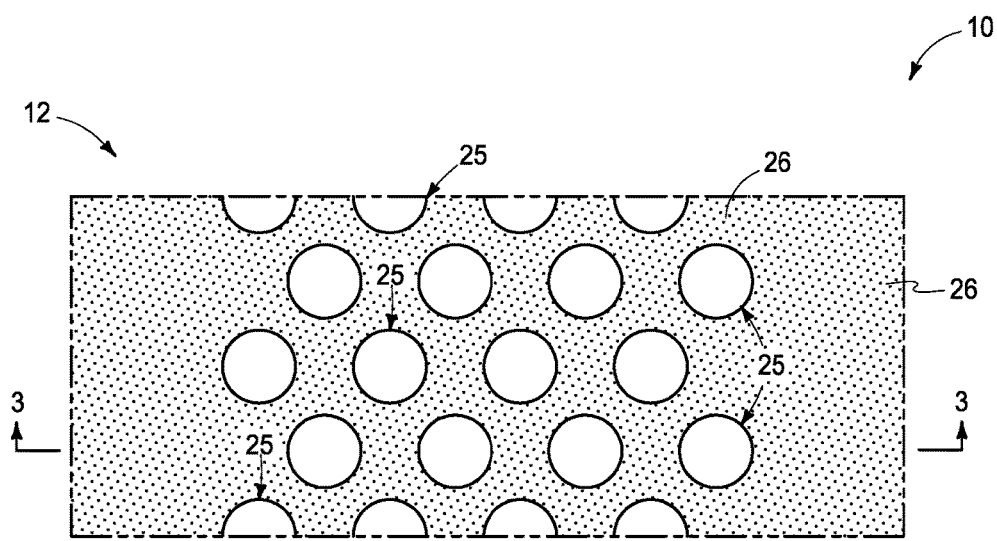
FIGS. 2-21 are diagrammatic sequential sectional and/or enlarged views of the construction of FIG. 1 in process in accordance with some embodiments of the invention.
Figure 3:
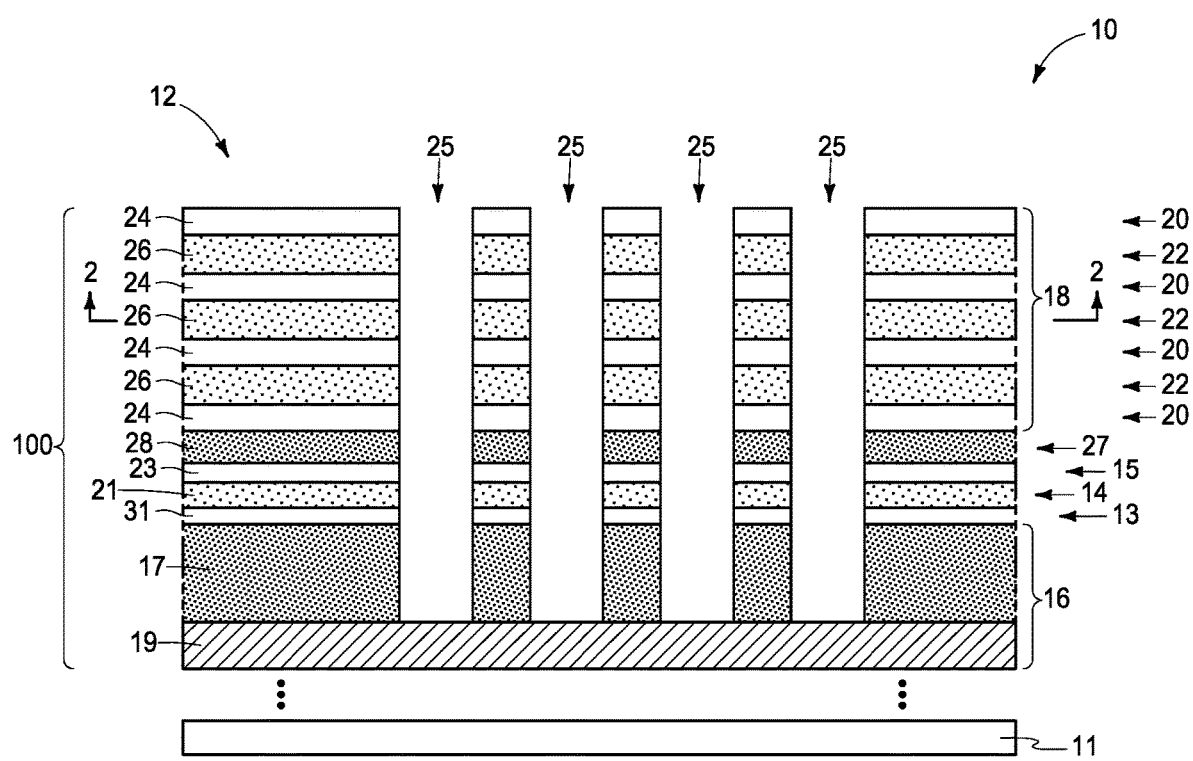

Referring to FIGS. 2 and 3, channel openings 25 have been formed (e.g., by dry anisotropic etching) into alternating tiers 20 and 22. By way of example only, channel openings 25 are shown as being arranged in groups or columns of staggered rows of four openings 25 per row. Any alternate existing or future-developed arrangement and construction may be used. Example channel openings 25 are shown as going into conductive tier 16 and in one embodiment as shown as going through material 17 and stopping on material 19.

Transistor channel material is formed in the individual channel openings to extend elevationaily through the insulative tiers and the wordline tiers, and individual memory cells of the array may be formed to comprise a gate region (e.g., a control-gate region) and a memory structure laterally between the gate region and the channel material. In one such embodiment, the memory structure is formed to comprise a charge-blocking region, storage material (e.g., charge-storage material), and insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a bandgap-engineered structure having nitrogen containing material [e.g., silicon nitride] sandwiched between two insulator oxides [e.g., silicon dioxide]) is laterally between the channel material and the storage material.

Figure 4:
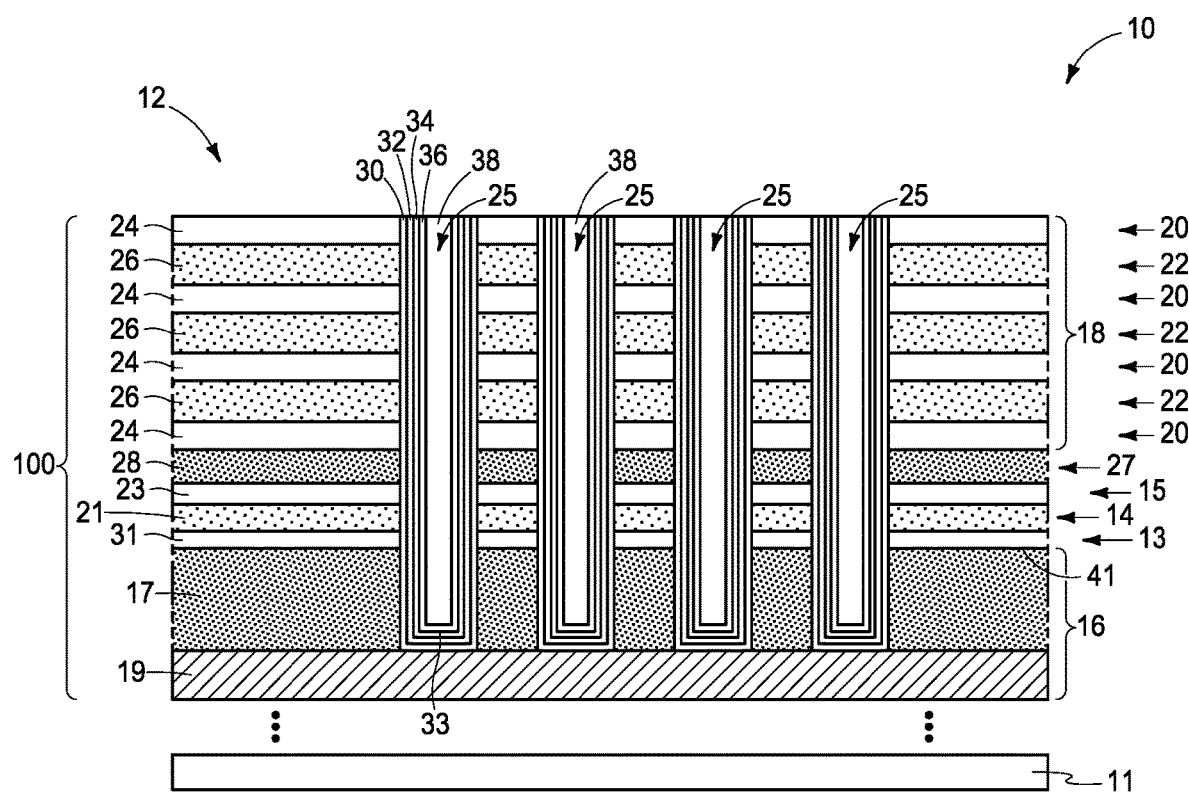

FIG. 4 shows one embodiment wherein charge-blocking material 30, storage material 32, and charge-passage material 34 have been formed in individual channel openings 25 elevationally along insulative tiers 20 and wordline tiers 22. Transistor materials 30, 32 and 34 (e.g., memory cell materials) may be formed by, for example, deposition of respective thin layers thereof over stack 18 and within individual channel openings 25 followed by planarizing such back at least to an uppermost surface of stack 18. Punch etching may be conducted (not shown) to remove materials 30, 32, and 34 from the bases of channel openings 25 to expose (not shown) conductive tier 16. Channel material 36 has been formed in channel openings 25 elevationally along insulative tiers 20 and wordline tiers 22. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 are 25 to 100 Angstroms. Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown). Regardless, and in one embodiment as shown, channel material 36 has been formed into conductive tier 16 and has a bottom 33 that is nowhere directly against any conductive material in conductive tier 16. In one embodiment, channel material 36 is formed through conductively-doped semiconductive material tier 27.

Figure 5:
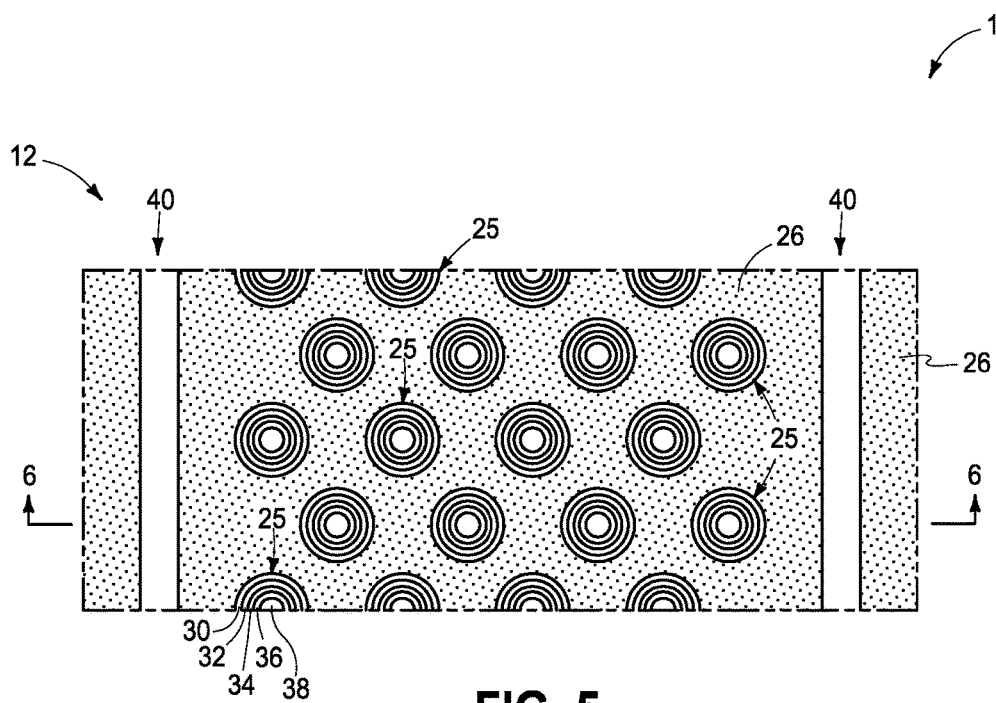
Figure 6:
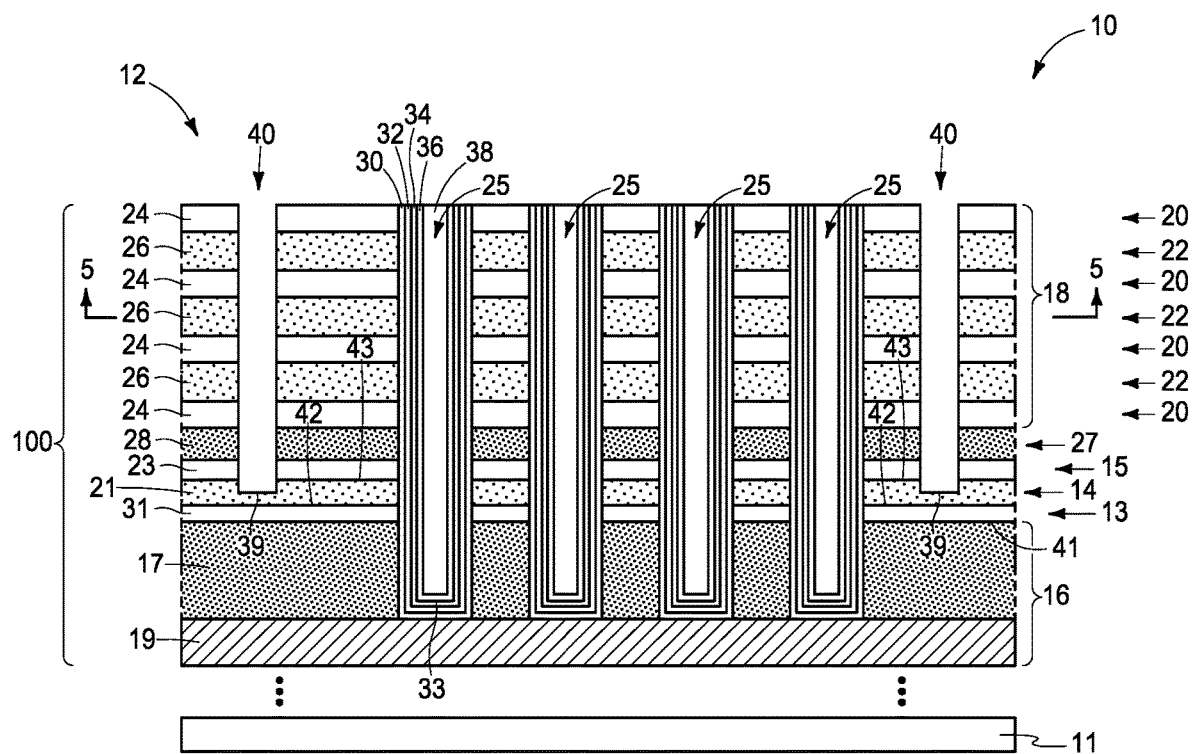

Referring to FIGS. 5 and 6, horizontally-elongated trenches 40 have been formed (e.g., by anisotropic etching) through stack 18 to sacrificial material tier 14. In one embodiment, horizontally-elongated 40 trenches have respective bottoms 39 that are above a bottom 41 of first insulator tier 13. In one such embodiment, bottoms 39 of horizontally-elongated trenches 40 are above a top 42 of first insulator tier 13 and, in one such latter embodiment, bottoms 39 of horizontally-elongated trenches 40 are below a top 43 of sacrificial material tier 14.

Figure 7:
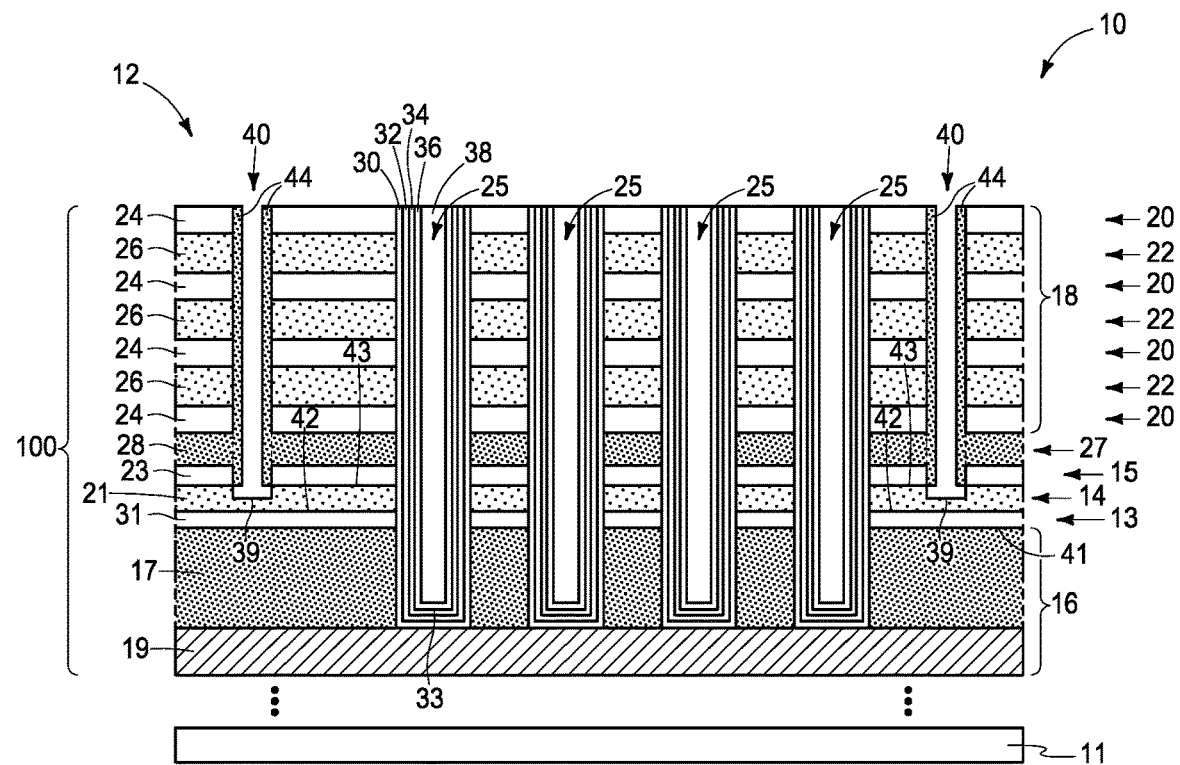

Referring to FIG. 7, and in one embodiment, a sacrificial sidewall liner 44 (e.g., doped or undoped polysilicon) has been formed in horizontally-elongated trenches 40. Such may be of the same composition as that of conductively-doped serniconductive material 28 of conductively-doped semiconductive material tier 27. Such a liner 44 may be provided, for example, wherein material 26 is sacrificial and comprises the same composition as that of sacrificial material 21 (e.g., silicon nitride). Such may be subjected to a punch-etch, for example as shown, to remove liner 44 from extending completely across bottoms 39 of trenches 40 to expose sacrificial material 21 of sacrificial material tier 14.

Figure 8:
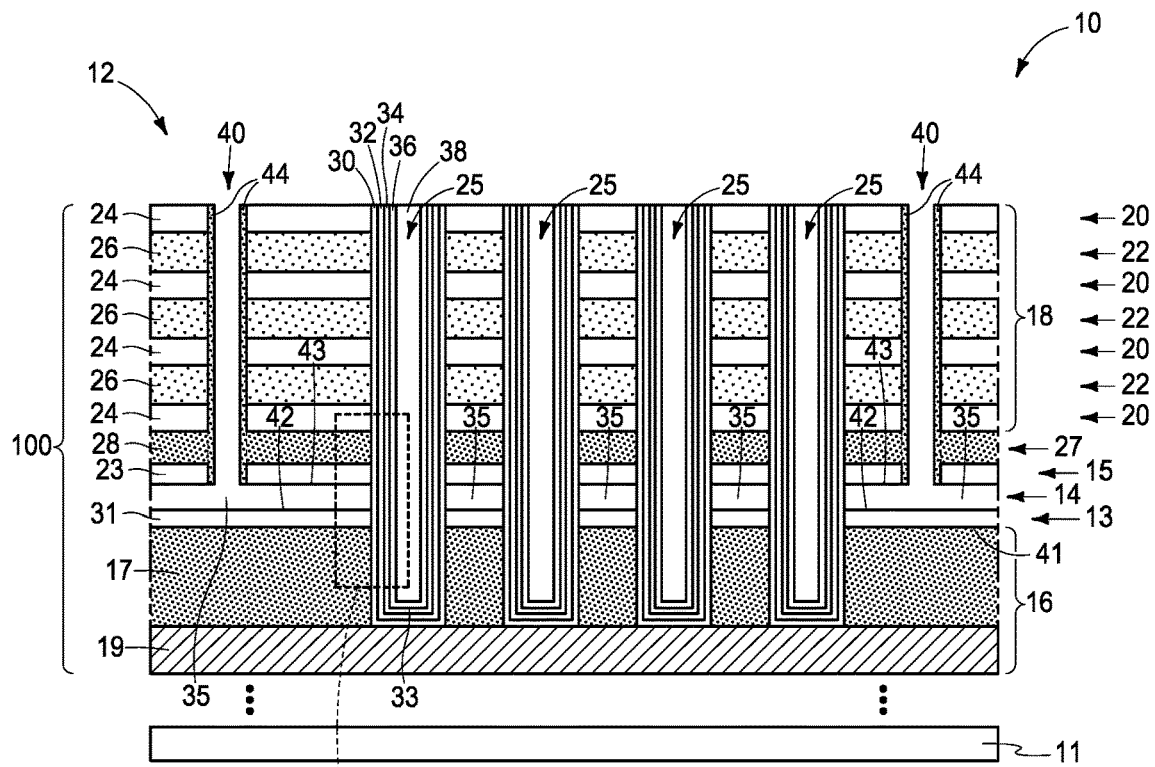

Referring to FIG. 8, sacrificial material 21 (not shown) has been etched (e.g., by wet etching, for example using $H_3PO_4$ where sacrificial material comprises silicon nitride) through horizontally-elongated trenches 40 selectively relative to material 31 of first insulator tier 13 and selectively relative to material 23 of second insulator tier 15. Such has formed a void space 35. Thickness of sacrificial sidewall liner 44, when present, may be reduced thereby, for example as shown.

Figure 9:
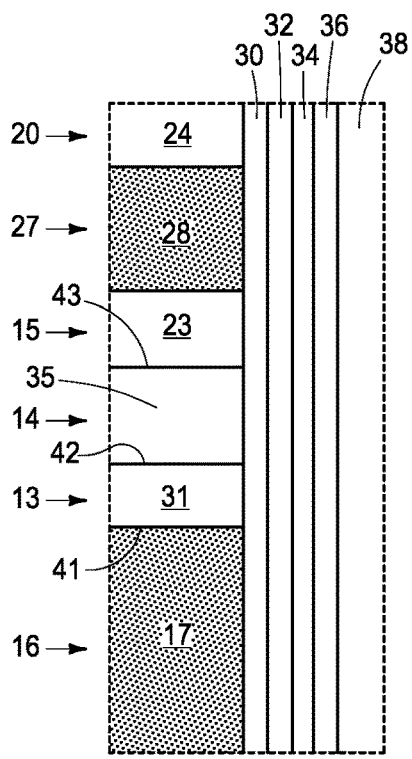

A laterally-outer sidewall of the channel in the sacrificial material tier is ultimately exposed. Such is shown, by way of example only, with respect to enlarged FIGS. 9-12. FIG. 9 is an enlarged view of a portion of FIG. 8 and FIGS. 10-12 show consecutive subsequent processing relative thereto.

Figure 10:
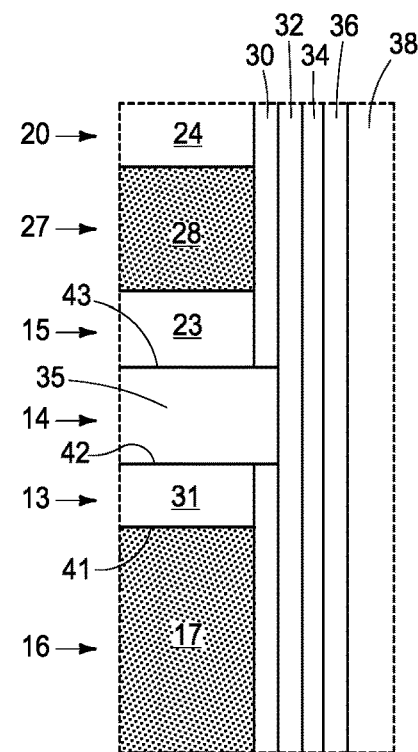

Referring to FIG. 10, material 30 in sacrificial material tier 14 has been etched to expose material 32 (e.g., using 100:1 [by volume] dilute HF where a material 30 comprises silicon dioxide). Such may etch material 30 upwardly and downwardly (not shown) relative to sacrificial material tier 14.

Figure 11:
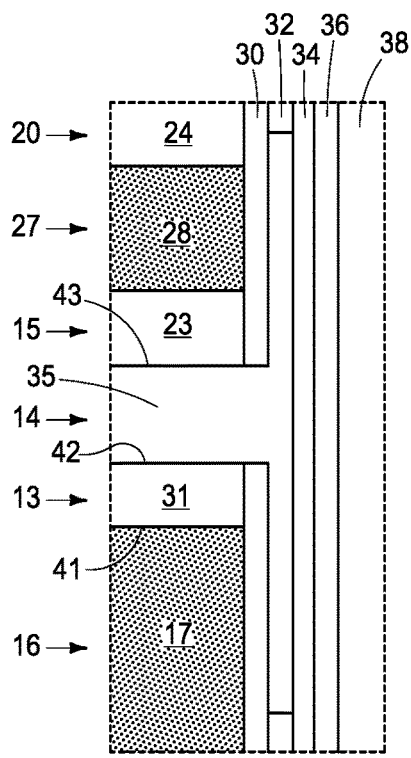

FIG. 11 shows etching of material 32 that is in sacrificial material tier 14 to expose material 34, with example upwardly and downwardly etching thereof also having resulted. Where, for example, material 32 comprises silicon nitride, such etching may occur by using $H_3PO_4$ or 1000:1 (by volume) ultra-dilute HF selectively relative to material 34 where at least a laterally-outermost portion thereof comprises silicon dioxide.

Figure 12:
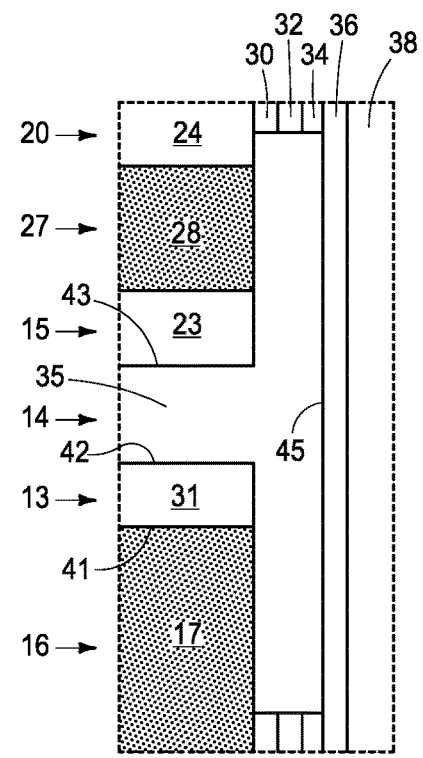

FIG. 12 shows example subsequent etching of exposed material 34 selectively relative to channel material 36, for example using 100:1 dilute HF if material 34 comprises silicon dioxide and/or also using, for example, $H_3PO_4$ if material 34 also comprises silicon nitride. Such has resulted in exposure of a laterally-outer sidewall 45 of channel material 36 in sacrificial material tier 14. Materials 30 and/or 34 may be etched upwardly and downwardly as shown.

Figure 13:
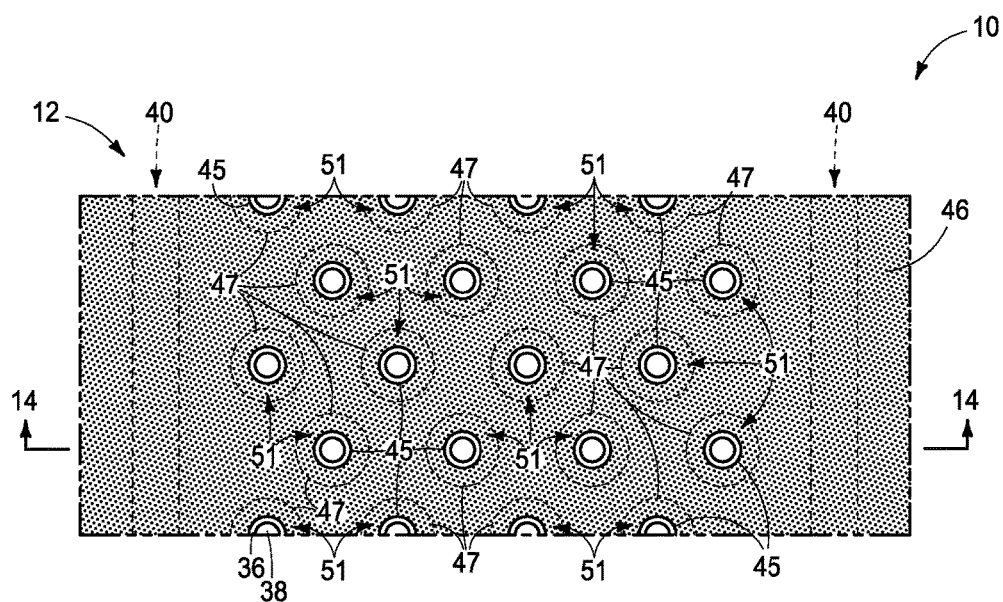
Figure 14:
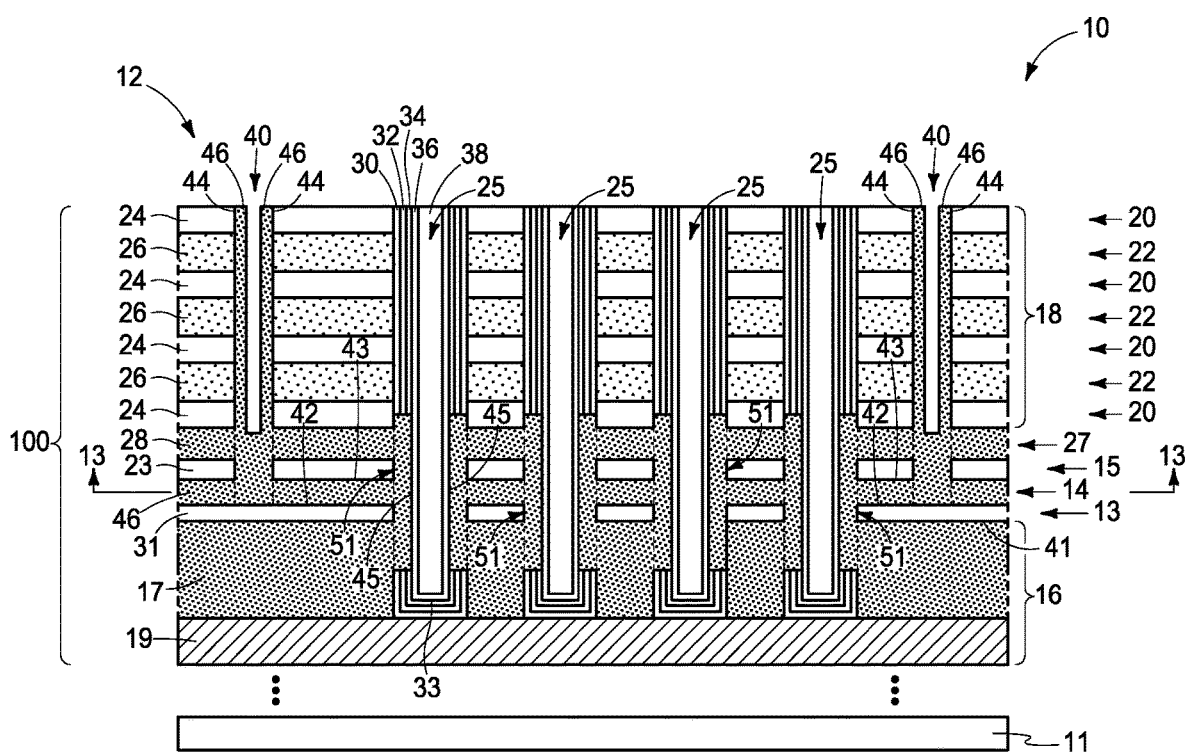

Referring to FIGS. 13 and 14, conductive material 46 has been formed within trenches 40 and within sacrificial material tier 14, resulting in the formation of a conductive structure 51 that is directly against laterally-outer sidewall 45 of channel material 36 in sacrificial material tier 14. Conductive structure 51 extends through first insulator tier 13 and directly electrically couples channel material 36 to conductive tier 16. In one embodiment, conductive material 46 is of the same composition as one or both of materials 28 and 17 (e.g., conductively-doped semiconductive material such as conductively-doped polysilicon). Such may also, in one embodiment, be of the same composition as sacrificial sidewall liner 44 where such is present. Regardless, and in one embodiment as shown, conductive structure 51 comprises an annulus 47 (FIG. 13). Further and regardless, and in one embodiment as shown, conductive structure 51 may be in conductively-doped semiconductive material tier 27 laterally between (a) channel material 36 that is in conductively-doped semiconductive material tier 27 and (b) conductively-doped semiconductive material 28 of conductively-doped semiconductive material tier 27. In one embodiment, conductivity-increasing dopant that is in conductively-doped semiconductive material 28 is diffused laterally (e.g., by a dedicated anneal step or merely by inherent thermal processing in the process) through conductive structure 51 into channel material 36 and upwardly into channel material 36 that is above (and perhaps below) conductively-doped semiconductive material tier 27. In one such embodiment, conductive structure 51 comprises conductively-doped semiconductive material (e.g., 46) comprising the conductivity-increasing dopant before and after such diffusing action.

Figure 15:
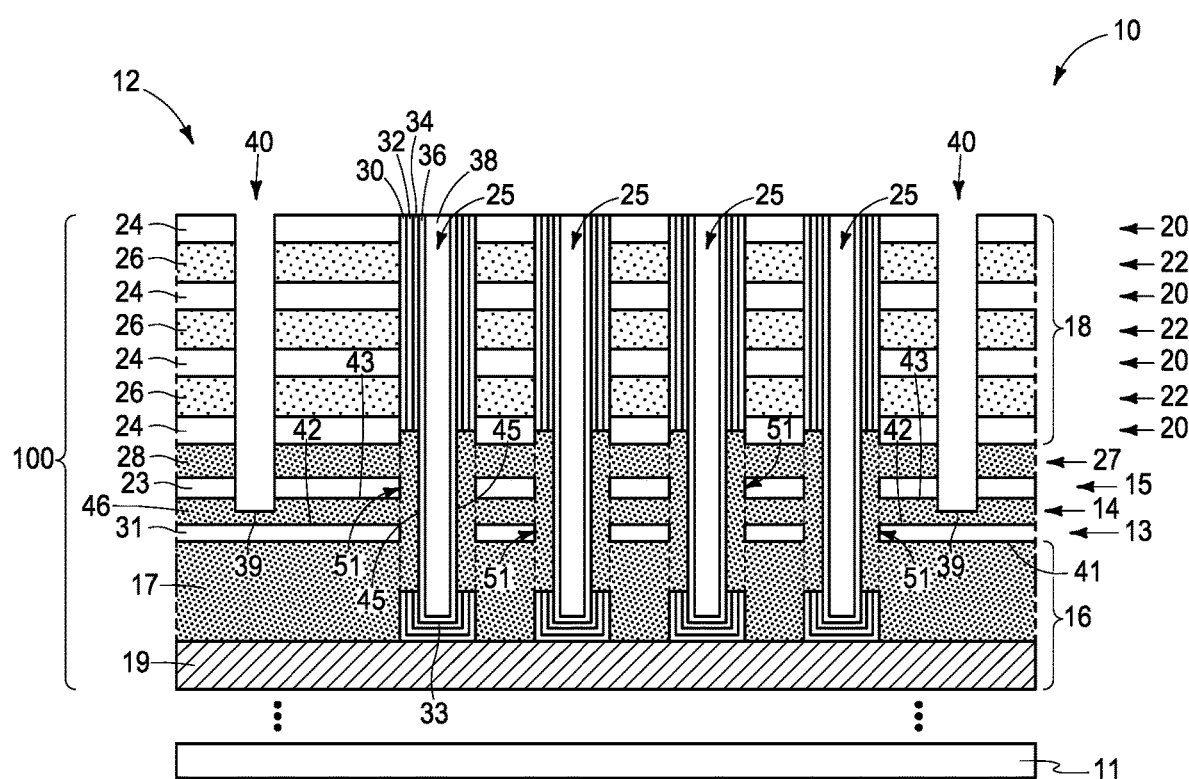

Referring to FIG. 15, conductive material 46 (not shown) and sacrificial sidewall liner 44 (not shown) when present have been removed through trenches 40 at least to below conductively-doped semiconductive material tier 27 (when present), for example as shown.

Figure 16:
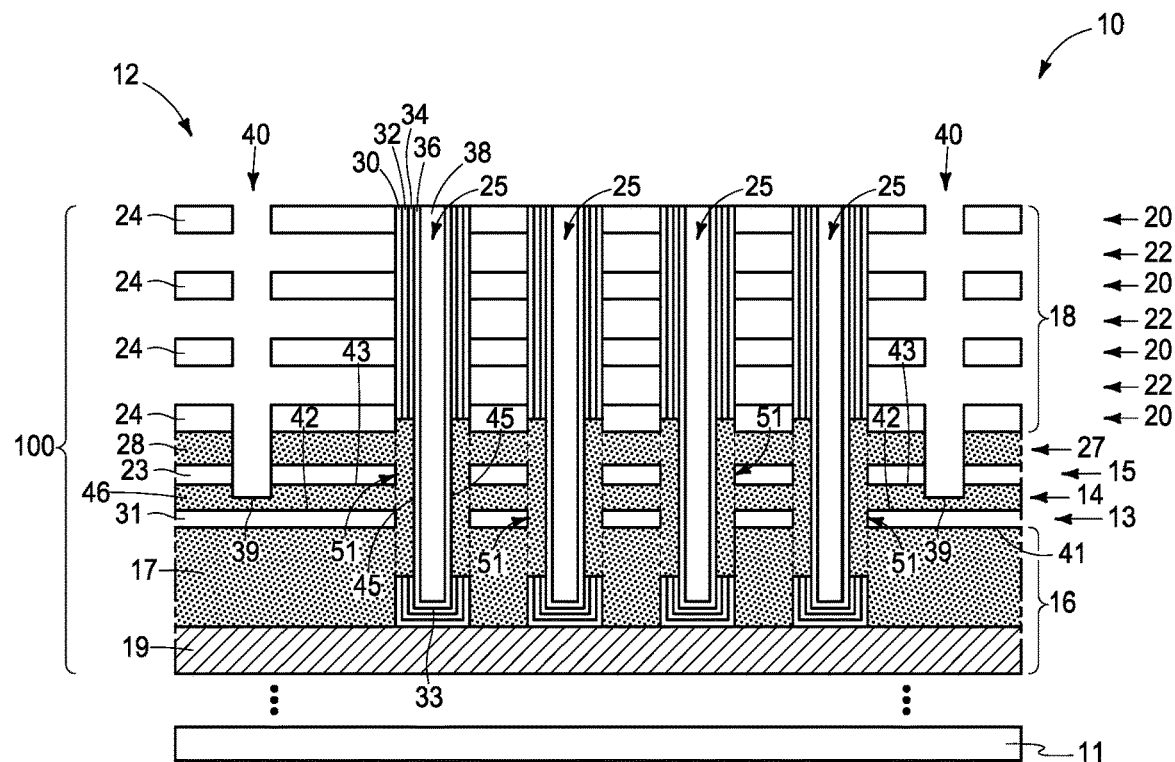

Referring to FIG. 16, first material 26 (not shown) of wordline tiers 22 has been etched selectively relative to second material 24 (e.g., using liquid or vapor $H_3PO_4$ or 1000:1 [by volume] ultra-dilute HF as a primary etchant where material 26 is silicon nitride and material 24 is silicon dioxide).

Figure 17:
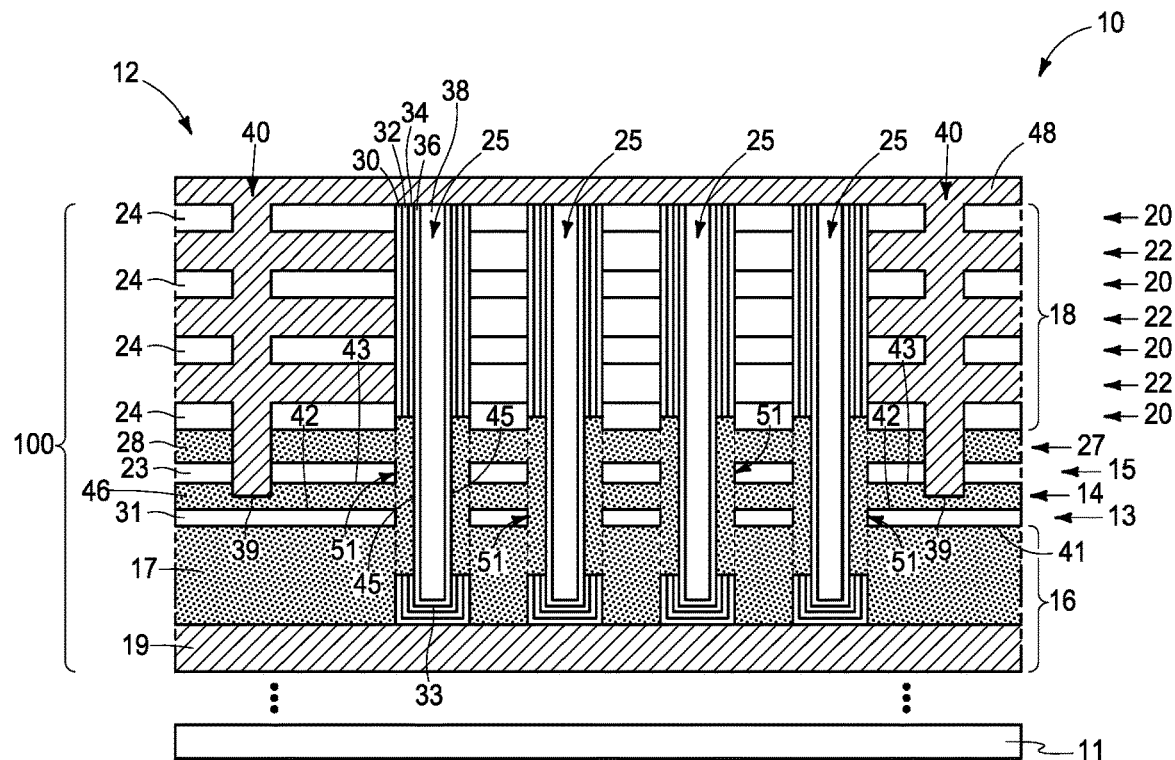

Referring to FIG. 17, conductive material 48 has been formed into wordline tiers 22 through trenches 40 and which will comprise conductive material of the individual wordlines to be formed. In but one example embodiment, conductive material 48 comprises a first-deposited conformal titanium nitride liner (not shown) followed by deposition of another composition metal material (e.g., elemental tungsten)

Figure 18:
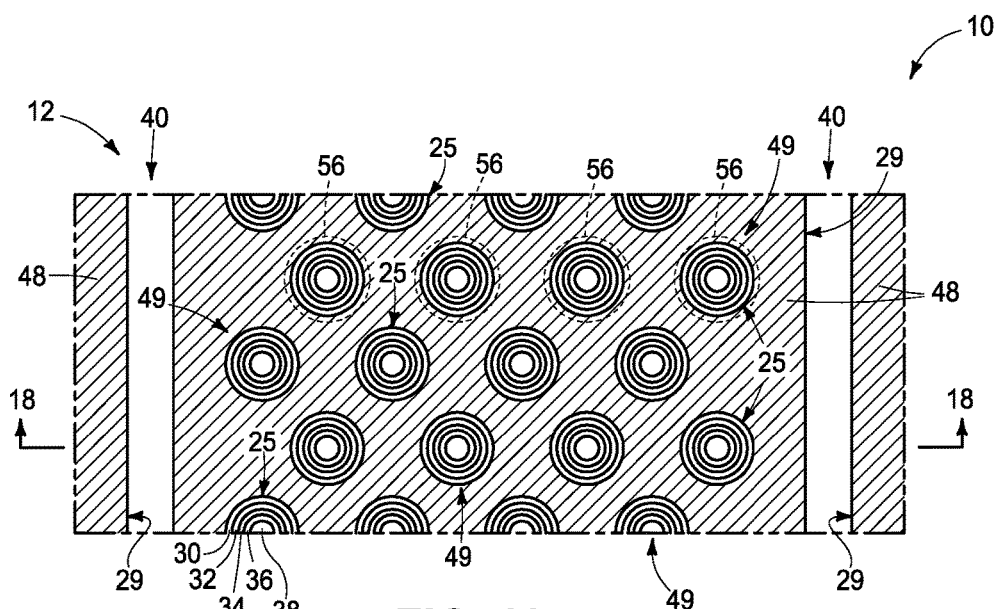
Figure 19:
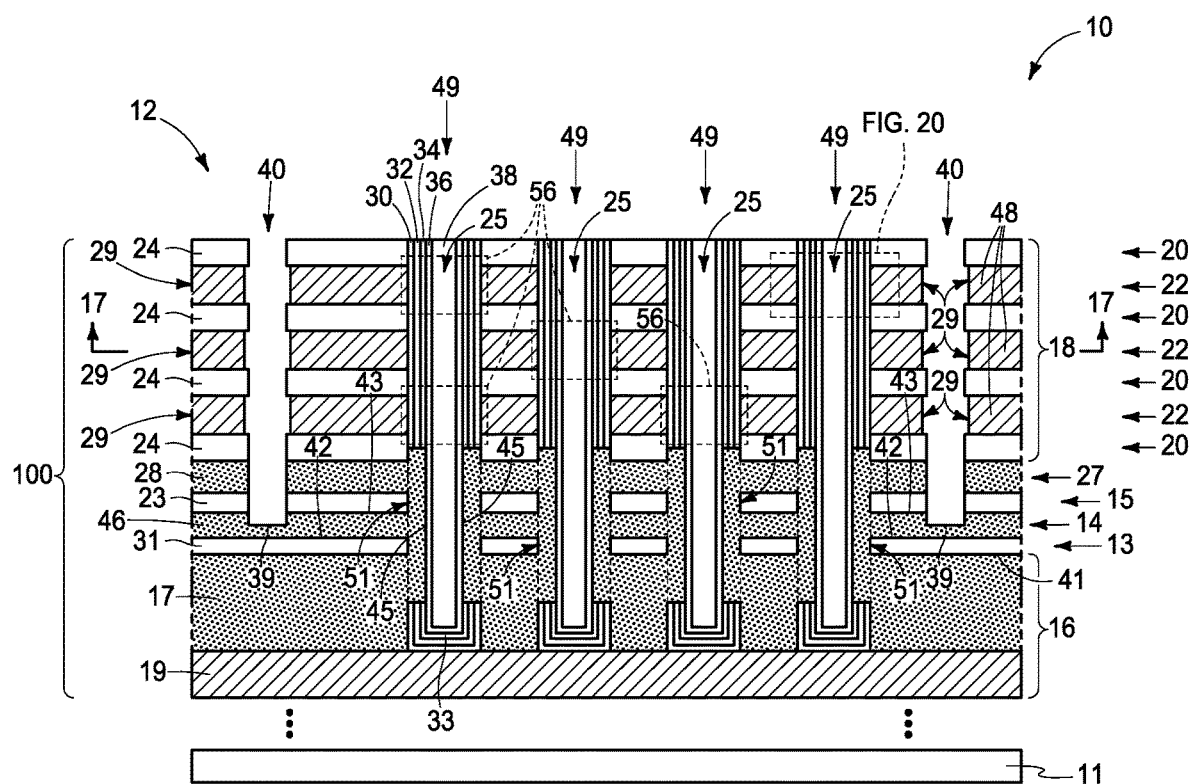
Figure 20:
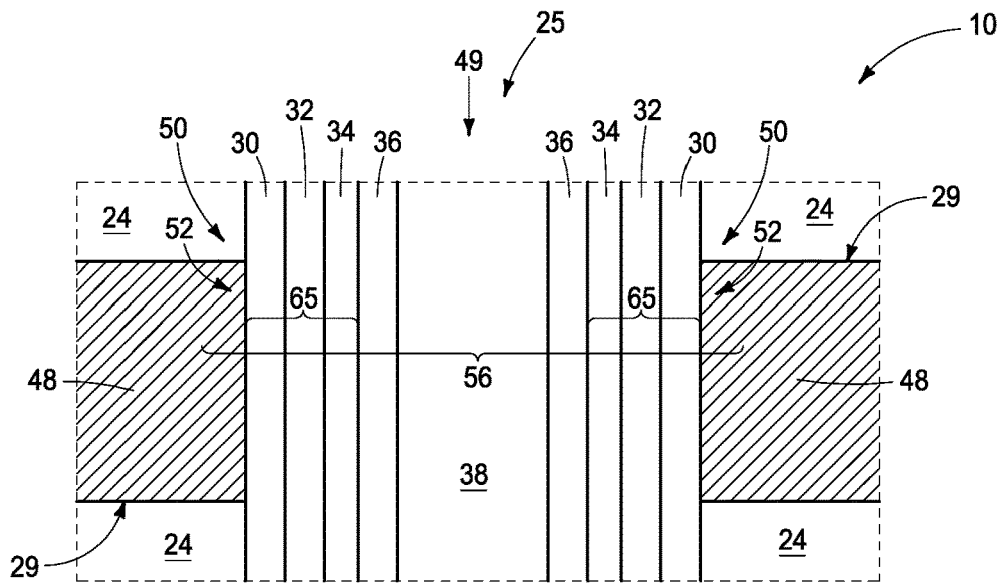

Referring to FIGS. 18-20, conductive material 48 has been removed from individual trenches 40. Such has resulted in formation of wordlines 29 and elevationally-extending strings 49 of individual transistors and/or memory cells 56. Approximate locations of transistors and/or memory cells 56 are indicated with a bracket in FIG. 20 and some with dashed outlines in FIGS. 18 and 19, with transistors and/or memory cells 56 being essentially ring-like or annular in the depicted example. Conductive material 48 may be considered as having terminal ends 50 (FIG. 20) corresponding to control-gate regions 52 of individual transistors and/or memory cells 56. Control-gate regions 52 in the depicted embodiment comprise individual portions of individual wordlines 29. Materials 30, 32, and 34 may be considered as a memory structure 65 that is laterally between control-gate region 52 and channel material 36.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conductive material 48). Regardless, as an additional example, an interface of a storage material and conductive material of a control gate may be sufficient to function as a charge-blocking region in the absence of any separate-composition-insulator material 30. Further, an interface of conductive material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Figure 21:
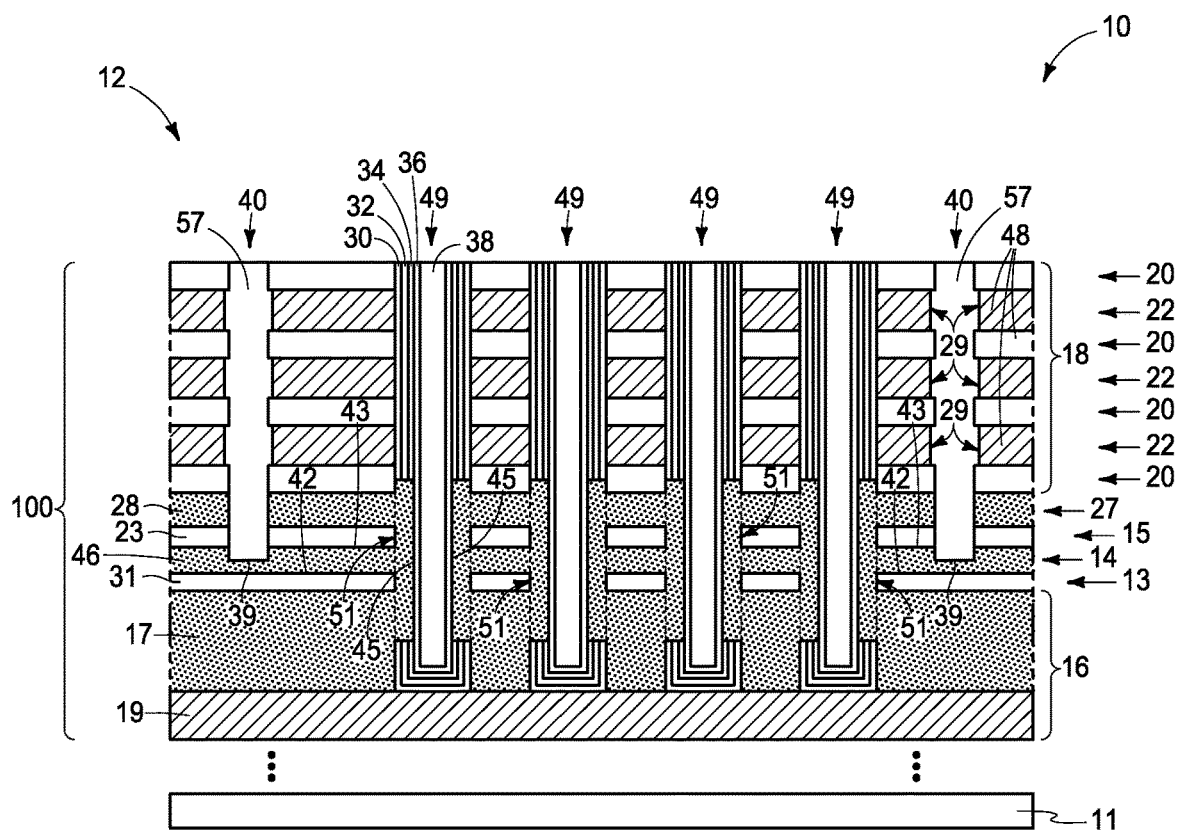

Referring to FIG. 21, a material 57 (dielectric and/or silicon-containing such as undoped polysilicon) has been formed in individual trenches 40.

In one embodiment and as described above, wordline tiers 22 comprise sacrificial material 26 and the method comprises replacing sacrificial material 26 of wordline tiers 22 with conductive wordline material 48 after forming conductive structure 51. In one such embodiment, wherein sacrificial sidewall liner 44 is formed in trenches 40, sacrificial sidewall liner 44 is removed after the etching of sacrificial material 21 in sacrificial material tier 14, and in one such embodiment is removed after forming conductive structure 51.

Any other attribute(s) or aspect(s) as shown and/or described herein with respect to other embodiments may be used with respect to the above-described embodiments.

Embodiments of the invention encompass memory arrays independent of method of manufacture. Nevertheless, such memory arrays may have any of the attributes as described herein in method embodiments. Likewise, the above-described method embodiments may incorporate and form any of the attributes described with respect to device embodiments.

In one embodiment, a memory array (e.g., 12) comprises a vertical stack (e.g., 100) comprising a conductive tier (e.g., 16), an insulator tier (e.g., 13) above the conductive tier, and a conductor tier (e.g., 14 in FIG. 21). The vertical stack comprises vertically-alternating insulative tiers (e.g., 20) and wordline tiers (e.g., 22) above the conductor tier. The wordline tiers comprise gate regions (e.g., 52) of individual memory cells (e.g., 56). The gate lines individually comprise part of a wordline (e.g., 29) in individual of the wordline tiers. Channel material (e.g., 36) extends elevationally through the insulative tiers and the wordline tiers. The individual memory cells comprise a memory structure (e.g., 65) between the gate region and the channel material. The memory structure comprises a charge-blocking region (e.g., 30) laterally inward of the individual gate regions, a storage region (e.g., 32) laterally inward of individual of the charge-blocking regions, and insulative charge-passage material (e.g., 34) laterally inward of individual of the storage regions. A conductive structure 51 extends through the insulator tier and directly electrically couples the channel material to the conductive tier. In one embodiment, the memory array comprises horizontally-elongated insulator structures (e.g., 57) extending elevationally through the insulative tiers and the wordline tiers, with such structures laterally separating individual wordlines in individual of the wordline tiers. The horizontally-elongated insulator structures individually have a bottom (e.g., 39 in FIG. 21) that is above a bottom (e.g., 41) of the insulator tier. In one such embodiment, the bottoms of the horizontally-elongated structures are above a top (e.g., 42) of the insulator tier, and in one such latter embodiment are below a top (e.g., 43 in FIG. 21) of the conductor tier. In one embodiment, another insulator tier (e.g., 15) is above the conductor tier and below a conductively-doped semiconductive material tier (e.g., 27). In one embodiment, the memory array comprises NAND. Any other attribute(s) or aspect(s) as shown and/or described herein with respect to other embodiments may be used.

In one embodiment, a memory array (e.g., 12) comprises a vertical stack (e.g., 100) comprising a conductive tier (e.g., 16), an insulator tier (e.g., 13) above the conductive tier, and a conductor tier (e.g., 14 in FIG. 21). The vertical stack comprises vertically-alternating insulative tiers (e.g., 20) and wordline tiers (e.g., 22) above the conductor tier. The wordline tiers comprise gate regions (e.g., 52) of individual memory cells (e.g., 56). The gate lines individually comprise part of a wordline (e.g., 29) in individual of the wordline tiers. Channel material (e.g., 36) extends elevationally through the insulative tiers and the wordline tiers. The individual memory cells comprise a memory structure (e.g., 65) between the gate region and the channel material. The memory structure comprises a charge-blocking region (e.g., 30) laterally inward of the individual gate regions, a storage region (e.g., 32) laterally inward of individual of the charge-blocking regions, and insulative charge-passage material (e.g., 34) laterally inward of individual of the storage regions, A conductive structure (e.g., 51) directly electrically couples the channel material to the conductive tier. Horizontally-elongated insulator structures (e.g., 57) extend elevationally through the insulative tiers and the wordline tiers and laterally separate individual of the wordlines and individually have a bottom (e.g., 39) that is above a bottom (e.g., 41) of the insulator tier. Any other attribute(s) or aspect(s) as shown and/or described herein with respect to other embodiments may be used.

An embodiment of the invention comprises a memory array (e.g., 12) comprising a vertical stack (e.g., 100) comprising a conductive tier (e.g., 16), a first insulator tier (e.g., 13) above the conductive tier, a conductor tier (e.g., 14 in FIG. 21) above the insulator tier, a second insulator tier (e.g., 15) above the conductive tier, and a conductively-doped semiconductive material tier (e.g., 27) above the second insulator tier. Vertically-alternating insulative tiers (e.g., 20) and wordline tiers (e.g., 22) are above the conductively-doped semiconductive material tier. The wordline comprise gate regions (e.g., 52) of individual memory cells (e.g., 56). Individual of the gate regions comprising part of a wordline (e.g., 29) in individual of the wordline tiers. Channel material (e.g., 36) extends elevationally through the insulative tiers and the wordline tiers, The individual memory cells comprising a memory structure (e.g., 65) between the individual gate regions and the channel material, The memory structure comprising a charge-blocking region (e.g., 30) laterally inward of the individual gate regions, a storage region (e.g., 32) laterally inward of individual of the charge-blocking regions, and insulative charge-passage material (e.g., 34) laterally inward of individual of the storage regions. A conductive structure (e.g., 51) extends through the conductively-doped semiconductive material tier, the second insulator tier, the conductor tier, and the first insulator tier. The conductive structure directly electrically couples the channel material to the conductive tier and comprises a sidewall (e.g., 45) that is directly against a sidewall of the conductive tier, Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s)

of components may be the same or different relative one another in different stacks/decks. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor ire with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, "selective" as to etch, etching, removing, removal, depositing, forming, and/or formation is such an act of one stated material relative to another stated material(s) so acted upon at a rate of at least 2:1 by volume. Further, selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of " " herein encompasses either and both.

CONCLUSION

In some embodiments, a method used in forming a memory array comprises forming a substrate comprising a conductive tier, a first insulator tier above the conductive tier, a sacrificial material tier above the first insulator tier, and a second insulator tier above the sacrificial material tier. A stack comprising vertically-alternating insulative tiers and wordline tiers is formed above the second insulator tier. Channel material is formed through the insulative tiers and the wordline tier. Horizontally-elongated trenches are formed through the stack to the sacrificial material tier. Sacrificial material is etched through the horizontally-elongated trenches selectively relative to material of the first insulator tier and selectively relative to material of the second insulator tier. A laterally-outer sidewall of the channel material is exposed in the sacrificial material tier. A conductive structure is formed directly against the laterally-outer sidewall of the channel material in the sacrificial material tier. The conductive structure extends through the first insulator tier and directly electrically couples the channel material to the conductive tier.

In some embodiments, a method used in forming a memory array comprises forming a substrate comprising a conductive tier, a first insulator tier comprising an insulative metal oxide above the conductive tier, a silicon nitride tier above the first insulator tier, and a second insulator tier comprising the insulative metal oxide above the silicon nitride tier. A stack comprising vertically-alternating insulative tiers and wordline tiers is formed above the second insulator metal oxide tier. Channel material is formed through the insulative tiers and the wordline tiers and into the conductive tier. Horizontally-elongated trenches are formed through the stack to the silicon nitride tier. The silicon nitride tier is wet etched through the horizontally-elongated trenches selectively relative to the insulative metal oxide of the first insulator tier and the insulative metal oxide of the second insulator tier. A laterally-outer sidewall of the channel material is exposed in the sacrificial material tier. A conductive structure is formed directly against the laterally-outer sidewall of the channel material in the sacrificial material tier. The conductive structure extends through the first insulator tier and directly electrically couples the channel material to the conductive tier.

In some embodiments, a memory array comprises a vertical stack comprising a conductive tier, an insulator tier above the conductive tier, a conductor tier above the insulator tier, and vertically-alternating insulative tiers and wordline tiers above the conductor tier. The wordline tiers comprise gate regions of individual memory cells. Individual of the gate regions comprise part of a wordline in individual of the wordline tiers. Channel material extends elevationally through the insulative tiers and the wordline tiers. The individual memory cells comprise a memory structure between the individual gate regions and the channel material. The memory structure comprises a charge-blocking region laterally inward of the individual gate regions, a storage region laterally inward of individual of the charge-blocking regions, and insulative charge-passage material laterally inward of individual of the storage regions. A conductive structure extends through the insulator tier and directly electrically couples the channel material to the conductive tier.

In some embodiments, a memory array comprises a vertical stack comprising a conductive tier, an insulator tier above the conductive tier, a conductor tier above the insulator tier, and vertically-alternating insulative tiers and wordline tiers above the conductor tier. The wordline tiers comprise gate regions of individual memory cells. Individual of the gate regions comprise part of a wordline in individual of the wordline tiers. Channel material extends elevationally through the insulative tiers and the wordline tiers. The individual memory cells comprise a memory structure between the individual gate regions and the channel material. The memory structure comprises a charge-blocking region laterally inward the individual gate regions, a storage region laterally inward of individual of the charge-blocking regions, and insulative charge-passage material laterally inward of individual of the storage regions. A conductive structure directly electrically couples the channel material to the conductive tier. Horizontally-elongated insulator structures extend elevationally through the insulative tiers and the wordline tiers. The horizontally-elongated insulator structures laterally separate individual of the wordlines and individually have a bottom that is above a bottom of the insulator tier.

In some embodiments, a memory array comprises a vertical stack comprising a conductive tier, a first insulator tier above the conductive tier, a conductor tier above the insulator tier, a second insulator tier above the conductive tier, a conductively-doped semiconductive material tier above the second insulator tier, and vertically-alternating insulative tiers and wordline tiers above the conductively-doped semiconductive material tier. The wordline tiers comprise gate regions of individual memory cells. Individual of the gate regions comprise part of a wordline in individual of the wordline tiers. Channel material extends elevationally through the insulative tiers and the wordline tiers. The individual memory cells comprise a memory structure between the individual gate regions and the channel material. The memory structure comprises a charge-blocking region laterally inward of the individual gate regions, a storage region laterally inward of individual of the charge-blocking regions, and insulative charge-passage material laterally inward of individual of the storage regions. A conductive structure extends through the conductively-doped semiconductive material tier, the second insulator tier, the conductor tier, and the first insulator tier. The conductive structure directly electrically couples the channel material to the conductive tier and comprises a sidewall that is directly against a sidewall of the conductive tier.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array, comprising: forming a substrate comprising a conductive tier, a first insulator tier above the conductive tier, a sacrificial material tier above the first insulator tier, a second insulator tier above the sacrificial material tier, and a stack comprising vertically-alternating insulative tiers and wordline tiers above the second insulator tier; forming channel material through the vertically-alternating insulative tiers and wordline tiers; forming horizontally-elongated trenches through the stack to the sacrificial material tier; etching sacrificial material of the sacrificial material tier through the horizontally-elongated trenches selectively relative to material of the first insulator tier and selectively relative to material of the second insulator tier, and exposing a laterally-outer sidewall of the channel material in the sacrificial material tier; and forming a conductive structure directly against the laterally-outer sidewall of the channel material in the sacrificial material tier, the conductive structure extending through the first insulator tier and directly electrically coupling the channel material to the conductive tier.

2. The method of claim 1 wherein the material of the first insulator tier and the material of the second insulator tier are of the same composition relative one another.

3. The method of claim 1 wherein the wordline tiers comprise the sacrificial material, and further comprising replacing the sacrificial material of the wordline tiers with conductive wordline material after forming the conductive structure.

4. The method of claim 3 comprising forming a sacrificial sidewall liner in the horizontally-elongated trenches before the etching and removing the sacrificial sidewall liner after the etching.

5. The method of claim 4 wherein the sacrificial sidewall liner is removed after forming the conductive structure.

6. The method of claim 1 comprising forming the channel material into the conductive tier, the channel material having a bottom that is nowhere directly against any conductive material in the conductive tier.

7. The method of claim 1 comprising forming a conductively-doped semiconductive material tier that is vertically between the second insulator tier and a lowest of the insulative tiers, the channel material being formed through the conductively-doped semiconductive material tier, the conductive structure being in the conductively-doped semiconductive material tier laterally between (a) the channel material that is in the conductively-doped semiconductive material tier, and (b) conductively-doped semiconductive material of the conductively-doped semiconductive material tier.

8. The method of claim 7 comprising diffusing conductivity-increasing dopant that is in the conductively-doped semiconductive material laterally through the conductive structure into the channel material and upwardly into the channel material that is above the conductively-doped semiconductive material tier.

9. The method of claim 8 wherein the conductive structure comprises conductively-doped semiconductor material comprising the conductivity-increasing dopant before and after said diffusing.

10. The method of claim 7 comprising forming a sacrificial sidewall liner in the horizontally-elongated trenches before the etching and removing the sacrificial sidewall liner after the etching, the sacrificial line being of the same composition as that of the conductively-doped semiconductive material of the conductively-doped semiconductive material tier.

11. The method of claim 1 wherein the horizontally-elongated trenches have respective bottoms that are above a bottom of the first insulator tier.

12. The method of claim 11 wherein the bottoms of the horizontally-elongated trenches are above a top of the first insulator tier.

13. The method of claim 12 wherein the bottoms of the horizontally-elongated trenches are below a top of the sacrificial material tier.

14. The method of claim 1 wherein the conductive structure comprises an annulus.

15. The method of claim 1 comprising forming CMOS under array circuitry.

16. A method used in forming a memory array, comprising: forming a substrate comprising a conductive tier, a first insulator tier comprising an insulative metal oxide above the conductive tier, a silicon nitride tier above the first insulator tier, a second insulator tier comprising the insulative metal oxide above the silicon nitride tier, and a stack comprising vertically-alternating insulative tiers and wordline tiers above the second insulator metal oxide tier; forming channel material through the vertically-alternating insulative tiers and wordline tiers and into the conductive tier; forming horizontally-elongated trenches through the stack to the silicon nitride tier; wet etching the silicon nitride tier through the horizontally-elongated trenches selectively relative to the insulative metal oxide of the first insulator tier and the insulative metal oxide of the second insulator tier, and exposing a laterally-outer sidewall of the channel material in the silicon nitride tier; and forming a conductive structure directly against the laterally-outer sidewall of the channel material in the silicon nitride tier, the conductive structure extending through the first insulator tier and directly electrically coupling the channel material to the conductive tier.

17. The method of claim 16 wherein the insulative metal oxide comprises $SiO_2$.

18. The method of claim 16 wherein the insulative metal oxide comprises multiple elemental metals.

19. The method of claim 18 wherein one of the elemental metals is Si.

20. The method of claim 16 wherein a least a majority of the insulative metal oxide is stoichiometric.

21. The method of claim 16 wherein a least a majority of the insulative metal oxide is non-stoichiometric.

22. The method of claim 16 comprising forming a conductively-doped semiconductive material tier that is vertically between the second insulator tier and a lowest of the insulative tiers, the channel material being formed through the conductively-doped semiconductive material tier, the conductive structure being in the conductively-doped semiconductive material tier laterally between (a) the channel material that is in the conductively-doped semiconductive material tier, and (b) conductively-doped semiconductive material of the conductively-doped semiconductive material tier.

* * * * *